(12) United States Patent
An et al.

(10) Patent No.: US 11,296,184 B2
(45) Date of Patent: Apr. 5, 2022

(54) DISPLAY PANELS, DISPLAY SCREENS, AND DISPLAY TERMINALS

(71) Applicants: SUZHOU QINGYUE OPTOELECTRONICS TECHNOLOGY CO., LTD., Kunshan (CN); YUNGU (GU'AN) TECHNOLOGY CO., LTD., Langfang (CN); KUNSHAN GO-VISIONOX OPTO-ELECTRONICS CO., LTD., Kushan (CN)

(72) Inventors: Leping An, Kunshan (CN); Junhui Lou, Kunshan (CN); Gaomin Li, Kunshan (CN); Yanqin Song, Kunshan (CN)

(73) Assignees: SUZHOU QINGYUE OPTOELECTRONICS TECHNOLOGY CO. LTD., Kunshan (CN); YUNGU (GU'AN) TECHNOLOGY CO., LTD., Langfang (CN); KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 160 days.

(21) Appl. No.: 16/923,089

(22) Filed: Jul. 8, 2020

(65) Prior Publication Data

US 2020/0335576 A1 Oct. 22, 2020

Related U.S. Application Data

(63) Continuation of application No. PCT/CN2019/084862, filed on Apr. 28, 2019.

(30) Foreign Application Priority Data

Aug. 6, 2018 (CN) .......................... 201810887040.0

(51) Int. Cl.
H01L 27/32 (2006.01)

(52) U.S. Cl.
CPC ...... *H01L 27/3283* (2013.01); *H01L 27/3246* (2013.01); *H01L 27/3267* (2013.01); *H01L 27/3286* (2013.01)

(58) Field of Classification Search
CPC .................. H01L 27/3246; H01L 27/3283
See application file for complete search history.

(56) References Cited

U.S. PATENT DOCUMENTS 9,893,140 B2 2/2018 He et al.
10,115,782 B2 10/2018 Tada et al.
(Continued)

FOREIGN PATENT DOCUMENTS

CN 1631057 A 6/2005
CN 1697583 A 11/2005
(Continued)

OTHER PUBLICATIONS

International Search Report of International Application No. PCT/CN2019/084862.
(Continued)

*Primary Examiner* — Daniel P Shook
(74) *Attorney, Agent, or Firm* — Kilpatrick Townsend & Stockton

(57) ABSTRACT

The present disclosure relates to a display panel, a display screen, and a display terminal. The display panel includes a substrate, a pixel-defining layer disposed on the substrate, and an isolation structure disposed on the pixel-defining layer. The isolation structure includes at least two layer structures stacked in sequence along a direction perpendicular to a surface of the substrate. At least one of the at least two layer structures has a width varied continuously or intermittently along an extending direction of the isolation structure. The extending direction of the isolation structure is parallel to the surface of the substrate. The width of the layer structure refers to a size of a projection, along a
(Continued)

direction perpendicular to the extending direction, of the layer structure on a plane coplanar with the surface of the substrate.

20 Claims, 6 Drawing Sheets

(56) References Cited

U.S. PATENT DOCUMENTS

| | | | |
|---|---|---|---|
| 10,651,242 | B2 | 5/2020 | Chen et al. |
| 11,081,529 | B2 | 8/2021 | Sagawa |
| 2003/0111957 | A1 | 6/2003 | Kim et al. |
| 2003/0170929 | A1 | 9/2003 | Guenther et al. |
| 2005/0019585 | A1 | 1/2005 | Kashiwagi et al. |
| 2005/0117347 | A1 | 6/2005 | Melpignano et al. |
| 2005/0253510 | A1 | 11/2005 | Nasu et al. |
| 2017/0025611 | A1 | 1/2017 | Huang |
| 2017/0062550 | A1 | 3/2017 | He et al. |
| 2018/0034007 | A1 | 2/2018 | He et al. |
| 2020/0194538 | A1* | 6/2020 | Lou ................ H01L 27/3234 |

FOREIGN PATENT DOCUMENTS

| | | |
|---|---|---|
| CN | 102130300 A | 7/2011 |
| CN | 102290430 A | 12/2011 |
| CN | 104766933 A | 7/2015 |
| CN | 106367716 A | 2/2017 |
| CN | 106920821 A | 7/2017 |
| CN | 107170905 A | 9/2017 |
| CN | 107275377 A | 10/2017 |
| CN | 107507522 A | 12/2017 |
| CN | 105118929 B | 1/2018 |
| CN | 208608202 U | 3/2019 |
| EP | 2503621 A1 | 9/2012 |
| JP | 11339958 A | 12/1999 |
| KR | 20070051644 A | 5/2007 |
| WO | 2019041910 A1 | 3/2019 |

OTHER PUBLICATIONS

Office Action of CN Patent Application No. 201810887040.0 dated Aug. 3, 2021.

* cited by examiner

DISPLAY PANELS, DISPLAY SCREENS, AND DISPLAY TERMINALS

CROSS-REFERENCE TO RELATED APPLICATIONS

This application is a continuation under 35 U.S.C. § 120 of international patent application PCT/CN2019/084862 filed on Apr. 28, 2019, which claims priority from Chinese Patent Application No. 201810887040.0, filed on Aug. 6, 2018 in the China National Intellectual Property Administration, the contents of both applications are hereby incorporated by reference.

FIELD

The present disclosure relates to the field of display technology, and particularly to display panels, display screens, and display terminals.

BACKGROUND

Demand for a higher screen-to-body ratio is increasing with a rapid development of display terminals. As a result, full-screen display of the display terminals has drawn more and more attention in the industry. The display terminal, such as a mobile phone, a tablet computer, and so on, is commonly integrated with a device such as a camera, a telephone receiver, an infrared sensor, and so on.

SUMMARY

A display panel, a display screen, and a display terminal are provided in embodiments of the present disclosure.

In one aspect, the present disclosure provides a display panel including a substrate, a pixel-defining layer disposed on the substrate, and an isolation structure disposed on the pixel-defining layer. The isolation structure includes at least two layer structures stacked in sequence along a direction perpendicular to a surface of the substrate. At least one of the at least two layer structures has a width varied continuously or intermittently along an extending direction of the isolation structure. The extending direction of the isolation structure is parallel to the surface of the substrate. The width of the layer structure refers to a size of a projection, along a direction perpendicular to the extending direction, of the layer structure on a plane of the surface of the substrate.

In the display panel as above described, the pixel-defining layer is provided with the isolation structure including at least two layer structures stacked in sequence along the direction perpendicular to the surface of the substrate. At least one of the at least two layer structures has a width varied continuously or intermittently along an extending direction of the isolation structure, thereby changing the uniformity of the width of the isolations structure along the extending direction. Therefore, diffraction fringes with different positions can occur at regions with different maximum widths when external lights pass by the isolation structure. The diffraction fringes with different positions can offset with each other, thereby effectively weakening the diffraction effect and preventing unpleasant results caused by the diffraction. When a camera is disposed under the display panel, images captured by the camera can have a high resolution.

In an embodiment, each of the layer structures has the width varied continuously or intermittently along the extending direction of the isolation structure.

In an embodiment, the layer structures have a wavy projection on the substrate along the extending direction of the isolation structure.

In an embodiment, the layer structures are axially symmetric along the extending direction.

In an embodiment, the pixel-defining layer defines a pixel opening configured to define a shape of a sub-pixel.

In an embodiment, the sub-pixel has a circular, oval, or dumbbell shape.

In an embodiment, an edge of a projection of the isolation structure on the plane of the surface of the substrate is not parallel to an edge of a projection of the pixel opening on the plane of the surface of the substrate.

In an embodiment, wave crests of projections of the layer structures on the plane of the surface of the substrate are staggered with each other.

In an embodiment, wave troughs of projections of the layer structures on the plane of the surface of the substrate are staggered with each other.

In an embodiment, the display panel is a PMOLED display panel.

In an embodiment, the isolation structure includes a first isolation layer and a second isolation layer. A bottom surface of the first isolation layer is in contact with the pixel-defining layer. A top surface of the first isolation layer is in contact with a bottom surface of the second isolation layer. A top surface of the second isolation layer is opposite to the bottom surface of the second isolation layer. A width of the bottom surface of the second isolation layer is larger than a width of the top surface of the first isolation layer.

In an embodiment, the first isolation layer has a trapezoidal longitudinal cross section perpendicular to the surface of the substrate. The second isolation layer has a rectangular longitudinal cross section perpendicular to the surface of the substrate. The bottom surface and the top surface of the second isolation layer have a same shape.

In an embodiment, a projection of the top surface of the second isolation layer on the plane of the surface of the substrate and a projection of the bottom surface of the first isolation layer on the plane of the surface of the substrate are stagger with each other.

In an embodiment, a ratio of a height of the first isolation layer to a height of the second isolation layer is 4:1.

In an embodiment, a maximum width of the bottom surface of the first isolation layer is 10 µm, or a maximum width of the second isolation layer is 10 µm.

In an embodiment, a minimum distance between two adjacent isolation structures is larger than or equal to 90 µm.

In another aspect, the present disclosure provided a display screen having one or more display regions. The one or more display regions include a first display region. A light-sensitive device is capable of being disposed under the first display region. The display panel as described in any one of the above embodiments is disposed in the first display region. Each of the one or more display regions is configured to display static or dynamitic images In an embodiment, the one or more display regions further includes a second display region. Another display panel is disposed in the second display region. The display panel disposed in the first display region is a PMOLED display panel or an AMOLED display panel. The other display panel disposed in the second display region is an AMOLED display panel.

In an embodiment, the first display region has a light transmittance larger than that of the second display panel.

In another aspect, the present disclosure provides a display terminal. The display terminal includes a equipment body having a device region. The display terminal further includes a display screen as described in any one of the above embodiments covered on the equipment body. The device region is located under the first display region. A light-sensitive device is disposed in the first display region to collect lights passing through the first display region.

DETAILED DESCRIPTION

Figure 1:
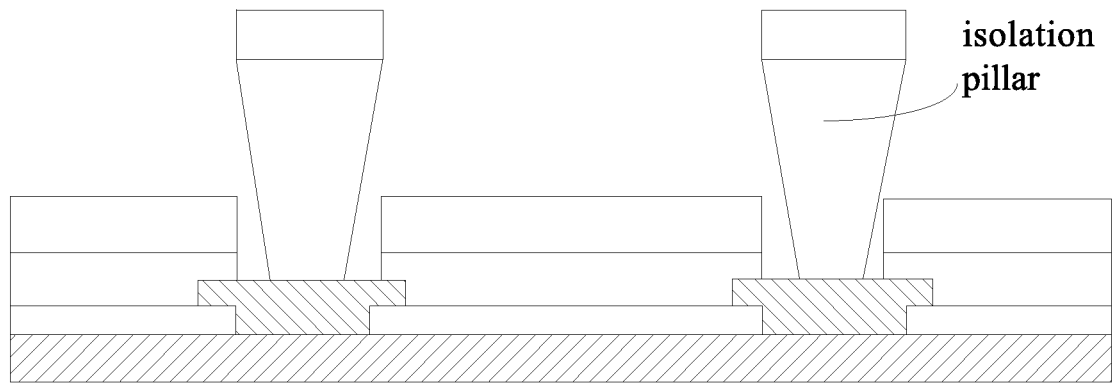
FIG. 1 is a cross-sectional view of a display panel.

Various designs of the display terminal can be notched, and a transparent display panel can be disposed at the notching region to achieve the full-screen display. However, when the light-sensitive device, such as a camera, is located under the display panel, a captured photo usually has a serious blurring problem.

For a clear understanding of the technical features, objects and effects of the present disclosure, specific embodiments of the present disclosure will now be described in detail with reference to the accompanying drawings. It is to be understood that the following description is merely exemplary embodiments of the present disclosure, and is not intended to limit the scope of the present disclosure.

In the description of the present disclosure, it is to be understood that orientation or position relationships indicated by terms such as "up", "down", "vertical", "horizontal", "top", "bottom", "inner", "outer", are orientation or position relationships shown on the basis of the drawings, are only used for conveniently describing the present disclosure and simplifying description without indicating or suggesting that appointed devices or elements must have specific orientations or be constructed and operated at the specific orientations. Therefore, the terms cannot be understood to limit the present disclosure. Besides, it should be noted that when an element is referred to as being "disposed on" another element, it can be directly connected to the other element or intervening elements may be present. When an element is referred to as being "connected to" another element, it can be directly connected to the other element or intervening elements may be present. In contrast, when an element is referred to as being "directly connected" to another element, there are no intervening elements present.

When being located under a transparent display panel, a light-sensitive device, such as a camera, may capture a blur photo. The inventors have found in the research that due to the presence of conductive wires located within a display panel of an electronic equipment, external lights passing by those conductive wires have complex diffraction intensity distribution, which results in diffraction fringes and thus affects a normal operation of the light-sensitive device such as the camera. For example, external lights will have an obvious diffraction when passing by the conductive wires located within the display panel, so that the image captured by the camera may have a distortion when the camera is operated under the transparent display region.

In order to solve the problem as described above, a display panel is provided in an embodiment of the present disclosure. The display panel includes a substrate, a pixel-defining layer disposed on the substrate, and an isolation structure disposed on the pixel-defining layer. The pixel-defining layer defines a plurality of pixel openings. The pixel opening is configured to define a shape of a sub-pixel. The isolation structure is configured to isolate cathodes of two adjacent rows or columns of sub-pixels and define shapes of the cathodes of two adjacent rows or columns of sub-pixels.

In some embodiments, the isolation structure includes at least two layer structures stacked in sequence with each other along a direction perpendicular to a surface of the substrate. In an embodiment, the isolation structure can include a first isolation layer and a second isolation layer stacked in sequence with each other in the direction perpendicular to the surface of the substrate. In another embodiment, the isolation structure can include three or more layer structures. At least one of the at least two layer structures has a width varied continuously or intermittently along an extending direction of the isolation structure. The extending direction (i.e. a length direction) of the isolation structure is parallel to the surface of the substrate. A width direction of the isolation structure is perpendicular to the length direction of the isolation structure. The width of the isolation structure refers to a size of a projection of the isolation structure, and the projection is projected along a direction perpendicular to the extending direction on a plane of the surface of the substrate. Since the isolation structure is a three-dimensional structure, the cross section of isolation structure perpendicular to the substrate (i.e. the longitudinal cross section of the isolation structure) may have different widths at different heights. The width of the isolation structure refers to a maximum width of the longitudinal cross section.

Since the isolation structure is a three-dimensional structure, the layer structures are also three-dimensional structures. Therefore, the longitudinal cross section (i.e. the cross section perpendicular to the substrate) of the isolation structure can have different widths at different heights. External lights passing by the layer structures may have a diffraction phenomenon. The diffraction is a physical phenomenon that light deviates from its straight travel direction when it encounters an obstacle. More specifically, light waves may be bent or scattered in a certain extent after passing by an obstacle, such as a slit, an aperture, or a disk. Therefore, diffraction fringes may occur as in a single slit diffraction when external lights pass by the isolation structure. The positions of the diffraction fringes are decided by maximum widths at various regions of the isolation structure. Therefore, by having the width of at least one layer structure of the isolation structure varied continuously or intermittently along the extending direction of the isolation structure, diffraction fringes with different positions can occur at different regions of the isolation structure with different widths when lights pass by the isolation structure, thereby weakening the diffraction effect and preventing unpleasant results caused by the diffraction.

Figure 2:
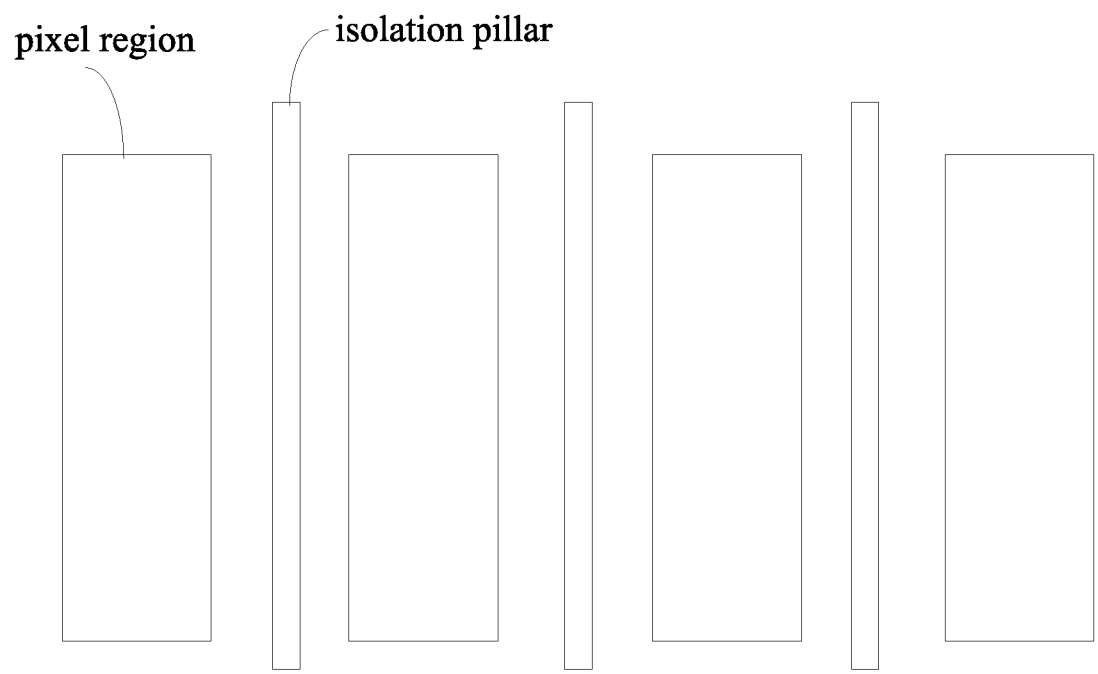
FIG. 2 is a top view of an isolation pillar of the display panel of FIG. 1.

An isolation pillar generally has a bar shape with a schematic top view shown in FIG. 2 and a schematic cross-sectional view shown in FIG. 2. A longitudinal cross section (i.e. a cross section perpendicular to the substrate) of the isolation pillar has an inverted trapezoidal shape. More specifically, the isolation pillar has a bottom surface in contact with the substrate and a top surface opposite to the bottom surface. The isolation pillar is tapered from the top surface to the bottom surface, and thus has a maximum width at the top surface. The top surface has a rectangular shape, and the isolation pillar has a constant width along its length direction; that is, the widths at the different regions of the isolation pillar along an extending direction of the length (which is parallel to the substrate) are the same. Therefore, the diffraction fringes with the same position can occur at the different regions of the isolation pillar with the same width, thereby having an obvious diffraction effect and finally affecting the normal operation of the light-sensitive device located under the display panel; for example, the images captured by the camera may be distorted.

In the display panel of an embodiment of the present disclosure, since the isolation structure including at least two layer structures has a width varied continuously or intermittently along the extending direction, diffraction fringes with different positions can occur at the different regions of the isolation structure with different maximum widths, thereby changing the complex diffraction intensity distribution and thus weakening the diffraction and preventing unpleasant results caused by the diffraction.

In an embodiment, each of the layer structures has a width varied continuously or intermittently along the extending direction of the isolation structure, so as to ensure that the display panel has a better effect on preventing unpleasant results caused by the diffraction on a horizontal plane parallel to the substrate, which allows the whole display panel to have a better diffraction-weakening effect.

In an embodiment, each of the layer structures has a wavy projection on the substrate along the extending direction of the isolation structure, so that the width of each of the layer structures is varied continuously along the extending direction, thereby changing the uniformity of the width of the isolation structure along the extending direction and weakening the diffraction effect. In an embodiment, each of the layer structures is axially symmetric along the extending direction to simplify the manufacturing process.

In an embodiment, wave troughs or wave crests of projections of different layer structures on the plane of the surface of the substrate are staggered with each other to further change the uniformity of the maximum width of the isolation structure along the extending direction. When lights pass by the isolation structure, the diffraction fringes with different positions can occur at different regions of the isolation structure, thereby effectively weakening the diffraction effect and preventing the unpleasant results caused by the diffraction.

Figure 3:
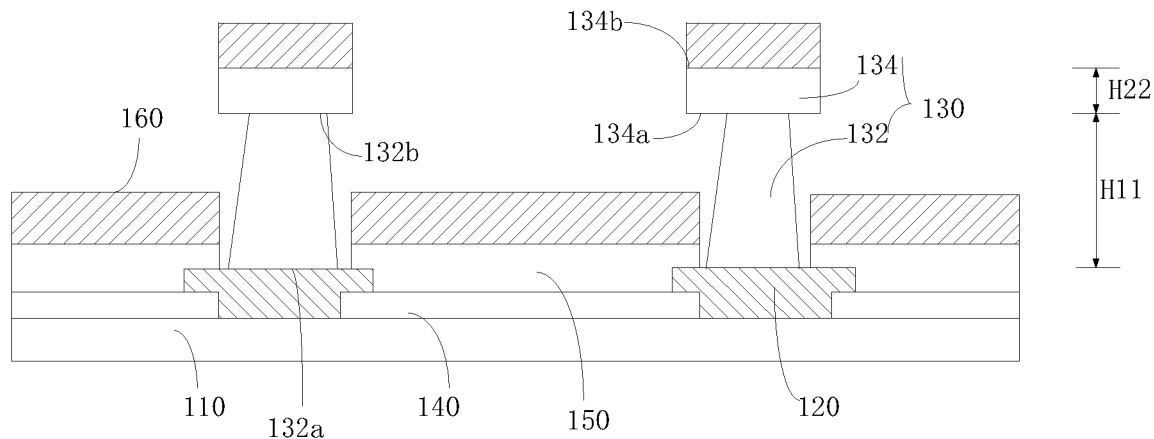
FIG. 3 is a cross-sectional view of a display panel according to an embodiment of the present disclosure.

FIG. 3 is a schematic cross-sectional view of a display panel in an embodiment of the present disclosure. The display panel is a passive matrix organic light-emitting diode (PMOLED) display panel. The display panel includes a substrate 110, a pixel-defining layer 120 disposed on the substrate 110, and an isolation structure 130 disposed on the pixel-defining layer 120. The isolation structure 130 includes a first isolation layer 132 and a second isolation layer 134 stacked in sequence with each other. A bottom surface 132a of the first isolation layer 132 is in connection with the pixel-defining layer 120. A top surface 132b of the first isolation layer 132 is in connection with a bottom surface 134a of the second isolation layer 134.

In an embodiment, in a longitudinal cross section (i.e. a cross section perpendicular to the substrate 110) of the isolation structure 130, a width of the top surface 132b of the first isolation layer 132 is smaller than a width of the bottom surface 134a of the second isolation layer 134, so that diffraction fringes, which occur when lights pass by different heights of the isolation structure along the direction perpendicular to the surface of the substrate 110, can have different positions. The diffraction fringes with different positions can offset with each other to weaken the diffraction effect.

In an embodiment, in the longitudinal cross section of the isolation structure 130, the first isolation layer 132 has a trapezoidal cross section, and the second isolation layer 134 has a rectangular cross section. More specifically, the width of the top surface 132b is smaller than a width of the bottom surface 132a of the first isolation layer 132, so as to form a regular trapezoidal structure. The second isolation layer 134 has a rectangular cross section; that is, a width of the top surface 134b is the same as the width of the bottom surface 134a of the second isolation layer 134. The top surface 134b also has the same shape as that of the bottom surface 134a of the second isolation layer 134.

Figure 4:
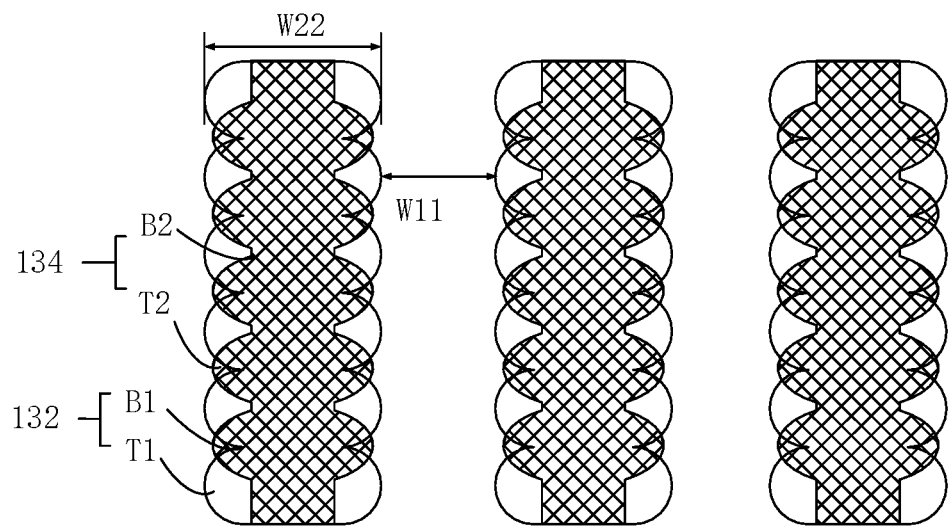
FIG. 4 is a schematic view of a projection of an isolation structure on a substrate according to an embodiment of the present disclosure.

In an embodiment, the top surface 134b of the second isolation layer 134 has a shape different from that of the bottom surface 132a of the first isolation layer 132. More specifically, the first isolation layer 132 and the second isolation layer 134 of the isolation structure 130 both have a wavy projection on the substrate 110, as shown in FIG. 4 in which a region filled with grid-lines is the projection of the second isolation layer 134 on the substrate 110. A wave crest T1 of the projection of the first isolation layer 132 on the substrate 110 is staggered with a wave crest T2 of the projection of the second isolation layer 134 on the substrate 110, and a wave trough B1 of the projection of the first isolation layer 132 on the substrate 110 is staggered with a wave trough B2 of the projection of the second isolation layer 134 on the substrate 110, so as to further change the uniformity of the width of the isolation structure 130 along an extending direction of the isolation structure 130 to weaken the diffraction effect.

Referring to FIG. 3, a height of one isolation structure is equal to a sum of heights of the first isolation layer 132 and the second isolation layer 134. In an embodiment, a ratio of a height H11 of the first isolation layer 132 to a height H22 of the second isolation layer 134 can be controlled to be about 4:1. The height H11 of the first isolation layer 132 and the height H22 of the second isolation layer 134 are not particularly limited in the present disclosure, as long as they are achievable in a manufacturing process. In an embodiment, as shown in FIG. 4, a maximum width W22 of the isolation structure 130 (i.e. a maximum width of the bottom surface 132a of the first isolation layer 132 or a maximum width of the second isolation layer 134) generally is about 10 μm. A minimum distance W11 between two adjacent isolation structures 130 is generally defined according to a size of the sub-pixel; for example, the minimum distance can be larger than or equal to about 90 μm.

Figure 5:
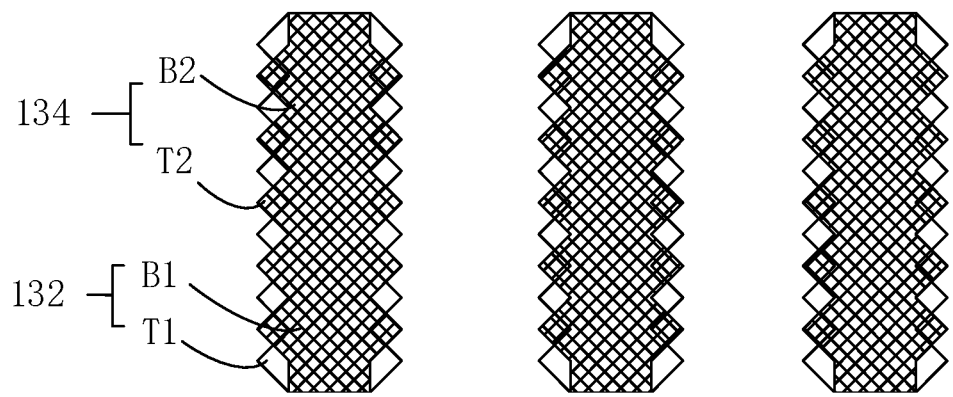
FIG. 5 is a schematic view of a projection of an isolation structure on a substrate according to another embodiment of the present disclosure.
Figure 6:
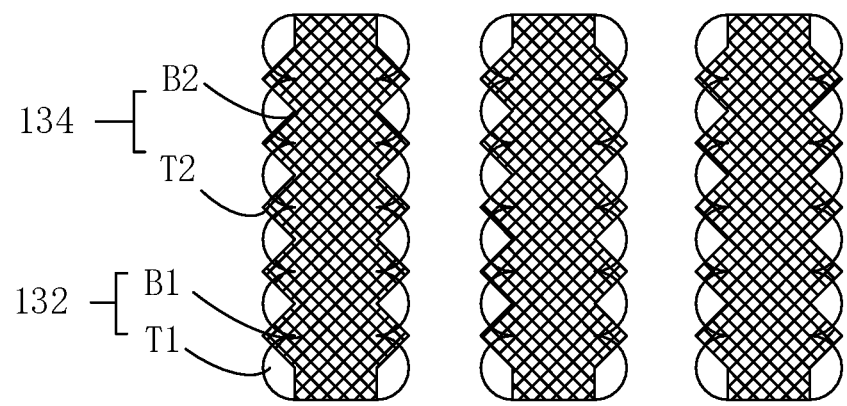
FIG. 6 is a schematic view of a projection of an isolation structure on a substrate according to yet another embodiment of the present disclosure.

In an embodiment as shown in FIG. 4, each of the first isolation layer 132 and the second isolation layer 134 has a wavy projection on the substrate 110. In another embodiment, each of the first isolation layer 132 and the second isolation layer 134 can have a zigzag projection on the substrate 110, as shown in FIG. 5 in which a region filled with grid-lines is the projection of the second isolation layer 134 on the substrate 110. In yet another embodiment, one of the first isolation layer 132 and the second isolation layer 134 can have a wavy projection on the substrate 110, and the other one of the first isolation layer 132 and the second isolation layer 134 can have a zigzag projection on the substrate 110, as long as the crests or troughs of the two projections are stagger with each other, as shown in FIG. 6.

Figure 7:
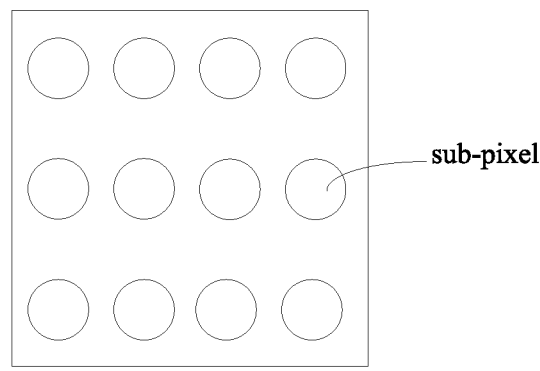
FIG. 7 is a schematic view of shapes of sub-pixels according to an embodiment of the present disclosure.
Figure 8:
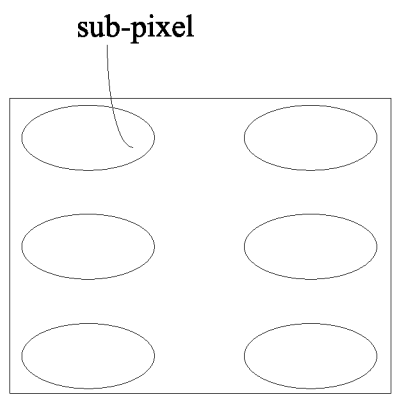
FIG. 8 is a schematic view of shapes of sub-pixels according to another embodiment of the present disclosure.
Figure 9:
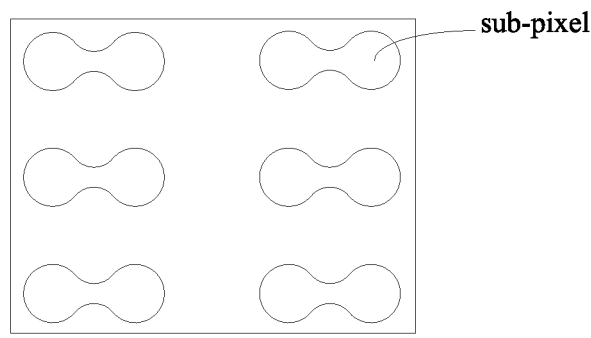
FIG. 9 is a schematic view of shapes of sub-pixels according to yet another embodiment of the present disclosure.

The pixel-defining layer 120 defines a plurality of pixel openings configured to define shapes of sub-pixels. A shape of a projection of the pixel opening on the substrate 110 has curved and non-parallel edges. Correspondingly, the sub-pixel also has curved and non-parallel edges. In an embodiment, as shown in FIG. 7, the sub-pixel has a circular shape. In another embodiment, as shown in FIG. 8, the sub-pixel has an oval shape. In yet another embodiment, as shown in FIG. 9, the sub-pixel has a shape like a dumbbell. Since the sub-pixel has a circular, oval, or dumbbell shape, an organic light-emitting layer 150 disposed in the pixel opening also has a circular, oval, or dumbbell shape. As such, if lights pass through the organic light-emitting layer 150, diffraction fringes with different positions and diverged in different directions would occur at regions with different widths, thereby weakening the diffraction effect.

In an embodiment, none of edges of the projection of the isolation structure 130 on the substrate 110 is parallel to any one of edges of the projection of the pixel opening (i.e. the organic light-emitting layer 150) on the substrate 110, so that the distances between edges of the projection of the isolation structure 130 and the projection of the pixel opening are not constant, so as to ensure that diffraction fringes with different positions occur at regions with the different distances, thereby finally weakening the diffraction effect.

In an embodiment, the display panel as described above is a PMOLED display panel, which further includes an anode layer 140 disposed on the substrate 110 and a cathode layer 160 disposed on the organic light-emitting layer 150. The organic light-emitting layer 150 is disposed on the anode layer 140, as shown in FIG. 1. In an embodiment, the anode layer 140 and the cathode layer 160 can be made of a transparent conductive metal oxide to increase a light transmittance of the display panel. For example, the anode layer 140 and the cathode layer 160 can be made of indium tin oxide (ITO) or indium zinc oxide (IZO). In addition, the anode layer 140 and the cathode layer 160 can also be made of a material such as aluminum-doped zinc oxide, silver-doped ITO, silver-doped IZO, and so on, so as to not only increase the light transmittance of the display panel, but also reduce resistances of conductive wires.

In an embodiment, widths of various layer structures of the isolation structure 130 are varied periodically along the extending direction of the isolation structure 130. More specifically, each sub-pixel can be located corresponding to a side edge of a same layer structure. The periodically varied widths can ensure the uniformity of brightness of sub-pixels at various regions of the display panel, so that the display effect of the display panel will not be affected. In other embodiments, the widths can also be varied irregularly to obtain a better effect on preventing unpleasant results caused by the diffraction.

In an embodiment, the display panel can be a transparent display panel or a semi-transparent and semi-reflective display panel. A material with a relative high light transmittance can be used for achieving the transparent property of the display panel. For example, if layers other than a light-blocking layer are made of materials with a light transmittance of above 90%, the whole display panel can have a light transmittance of above 70%. Furthermore, if all of the transparent functional layers are made of materials with a light transmittance of above 95%, then the light transmittance of the display panel will be further increased, for example, the whole display panel can have a light transmittance of above 80%. More specifically, materials of conductive wires such as the anode and the cathode can be selected from ITO, IZO, Ag-doped ITO, and Ag-doped IZO, and so on. Materials of insulative layers can be selected form $SiO_2$, $SiN_x$, $Al_2O_3$, and so on. The pixel-defining layer can be made of a high transparent material.

The substrate 110 can be a rigid substrate or a flexible substrate. The rigid substrate can be a transparent substrate selected from a glass substrate, a quartz substrate, a plastic substrate, and so on. The flexible substrate can be, for example, a flexible polyamide (PI) substrate.

Other technical means also can be used for achieving the transparent property of the display panel, as long as those technical means are appropriate for the structure of the display panel as described above. When in the working state, the transparent display panel or the semi-transparent and semi-reflective display panel can normally display images. When in other functional states as needed, the external lights can pass through the display panel to the light-sensitive devices located under the display panel.

Figure 10:
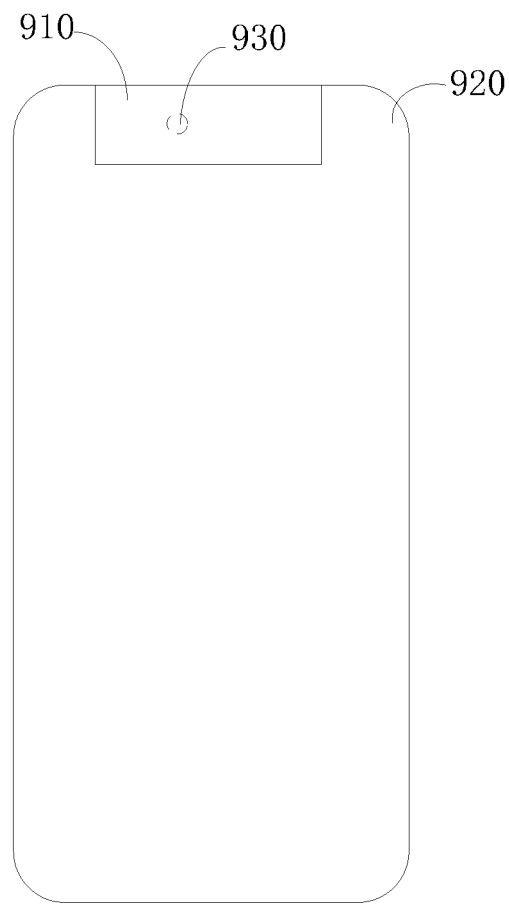
FIG. 10 is a schematic structure view of a display screen according to an embodiment of the present disclosure.

FIG. 10 is a schematic view of a display screen of one embodiment of the present disclosure. The display screen has a first display region 910 and a second display region 920. It is to be understood that the number of the first display region 910 and the second display region 920 is not limited to only one. The "first" and "second" is only to differentiate the types of the display regions. In an embodiment, the first display region 910 has a light transmittance larger than that of the second display region 920. A light-sensitive device 930 can be located under the first display region 910. The display panel as described in any one of the above embodiments can be disposed within the first display region 910. The first display region 910 and the second display region 920 can be both configured to display static images or dynamic images. Since the display panel as described-above is disposed within the first display region 910, the lights passing through the first display region 910 will not induce obvious diffraction effect, thereby ensuring the normal operation of the light-sensitive device 930 located under the first display region 910. It is to be understood that when the light-sensitive device 930 is not working, static images or dynamic images can be normally displayed in the first display region 910. When the light-sensitive device 930 is working, the first display region 910 can be in a non-display state to ensure that lights can be collected by the light-sensitive device 930 through the display panel. In other embodiments, the first display region 910 can also have a light transmittance the same as that of the second display region 920 to ensure the uniformity of the light transmittance of the whole display screen and good display effect of the display screen.

In an embodiment, a display panel disposed within the first display region 910 can be a PMOLED display panel or an AMOLED display panel, and a display panel disposed within the second display region 920 can be an AMOLED display panel. A full screen can be formed by the PMOLED display panel and the AMOLED display panel.

Figure 11:
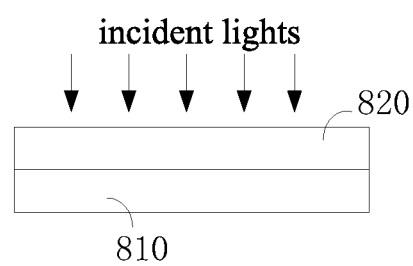
FIG. 11 is a schematic structure view of a display terminal according to an embodiment of the present disclosure.

A display terminal is further provided in an embodiment of the present disclosure. FIG. 11 is a schematic structure view of the display panel in an embodiment. The display terminal includes an equipment body 810 and a display screen 820 disposed on and connected to the equipment body 810. The display screen 820 can be the display screen described in any one of above embodiments. The display screen 820 is configured to display static images or dynamic images.

Figure 12:
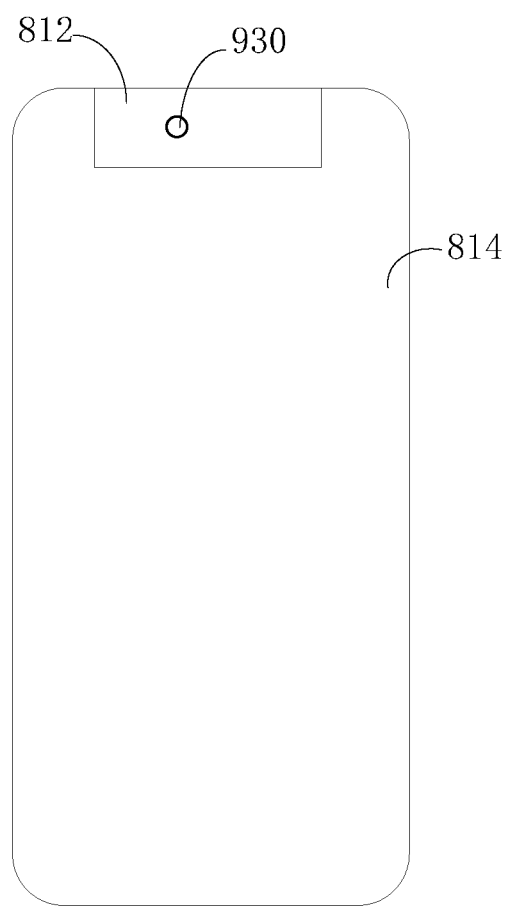
FIG. 12 is a schematic structure view of an equipment body of the display terminal according to an embodiment of the present disclosure.

FIG. 12 is a schematic structure view of the equipment body 810 in an embodiment. The equipment body 810 can be provided with a notching region 812 and a non-notching region 814. A light-sensitive device, such as a camera 930 or an optical sensor, can be disposed within the notching region 812. The display panel located within the first display region of the display screen 820 can be attached corresponding to the notching region 812, so that the external lights can pass through the first display region and can be collected or processed by the light-sensitive device such as the camera 930 or the optical sensor. Since the display panel located within the first display region can effectively weaken the diffraction effect generated in the first display region when the external lights pass through the first display region, the quality of images captured by the camera 930 of the display terminal can be effectively improved, the image distortion caused by the diffraction effect can be avoided, and the accuracy and sensitiveness of the light-sensitive device to the external lights can be increased.

The display terminal can be an electronic equipment such as a mobile phone, a flat plane computer, a handheld computer, and a digital equipment such as an ipod.

The technical features of the above-described embodiments may be arbitrarily combined. In order to make the description simple, not all possible combinations of the technical features in the above embodiments are described. However, as long as there is no contradiction in the combination of these technical features, the combinations should be in the scope of the present disclosure.

What described above are only several implementations of the present disclosure, and these embodiments are specific and detailed, but not intended to limit the scope of the present disclosure. It should be understood by the skilled in the art that various modifications and improvements can be made without departing from the conception of the present disclosure, and all fall within the protection scope of the present disclosure. Therefore, the patent protection scope of the present disclosure is defined by the appended claims

What is claimed is:

1. A display panel, comprising:
a substrate;
a pixel-defining layer disposed on the substrate; and
an isolation structure disposed on the pixel-defining layer; wherein:
the isolation structure comprises at least two layer structures stacked in sequence along a direction perpendicular to a surface of the substrate;
at least one of the at least two layer structures has a width varied along an extending direction of the isolation structure;
the extending direction of the isolation structure is parallel to the surface of the substrate; and
the width of the layer structure refers to a size of a projection, along a direction perpendicular to the extending direction, of the layer structure on a plane of the surface of the substrate.

2. The display panel of claim 1, wherein each of the at least two layer structures has the width varied continuously or intermittently along the extending direction of the isolation structure.

3. The display panel of claim 1, wherein the at least two layer structures have a wavy projection on the substrate along the extending direction of the isolation structure.

4. The display panel of claim 3, wherein wave crests of projections of the layer structures on the plane of the surface of the substrate are staggered with each other.

5. The display panel of claim 3, wherein wave troughs of projections of the at least two layer structures on the plane of the surface of the substrate are staggered with each other.

6. The display panel of claim 1, wherein the at least two layer structures are axially symmetric along the extending direction.

7. The display panel of claim 1, wherein the pixel-defining layer defines a pixel opening configured to define a shape of a sub-pixel.

8. The display panel of claim 7, wherein the sub-pixel has a circular, oval, or dumbbell shape.

9. The display panel of claim 7, wherein an edge of a projection of the isolation structure on the plane of the surface of the substrate is not parallel to an edge of a projection of the pixel opening on the plane of the surface of the substrate.

10. The display panel of claim 1, wherein the display panel is a PMOLED display panel.

11. The display panel of claim 10, wherein the isolation structure comprises a first isolation layer and a second isolation layer; a bottom surface of the first isolation layer is in contact with the pixel-defining layer; a top surface of the first isolation layer is in contact with a bottom surface of the second isolation layer; a top surface of the second isolation layer is opposite to the bottom surface of the second isolation layer; and a width of the bottom surface of the second isolation layer is larger than a width of the top surface of the first isolation layer.

12. The display panel of claim 11, wherein the first isolation layer has a trapezoidal longitudinal cross section perpendicular to the surface of the substrate, the second isolation layer has a rectangular longitudinal cross section perpendicular to the surface of the substrate, and the bottom surface and the top surface of the second isolation layer have a same shape.

13. The display panel of claim 11, wherein a projection of the top surface of the second isolation layer on the plane of the surface of the substrate and a projection of the bottom surface of the first isolation layer on the plane of the surface of the substrate are stagger with each other.

14. The display panel of claim 11, wherein a ratio of a height of the first isolation layer to a height of the second isolation layer is 4:1.

15. The display panel of claim 11, wherein a maximum width of the bottom surface of the first isolation layer is 10 μm, or a maximum width of the second isolation layer is 10 μm.

16. The display panel of claim 11, wherein a minimum distance between two adjacent isolation structures is larger than or equal to 90 μm.

17. A display screen, having one or more display regions, wherein the one or more display regions comprises a first display region, a light-sensitive device is capable of being disposed under the first display region, a display panel is disposed in the first display region, each of the one or more display regions is configured to display static or dynamitic images, and the display panel comprises:
a substrate;
a pixel-defining layer disposed on the substrate; and
an isolation structure disposed on the pixel-defining layer;

wherein:
the isolation structure comprises at least two layer structures stacked in sequence along a direction perpendicular to a surface of the substrate;
at least one of the at least two layer structures has a width varied continuously or intermittently along an extending direction of the isolation structure;
the extending direction of the isolation structure is parallel to the surface of the substrate; and
the width of the layer structure refers to a size of a projection, along a direction perpendicular to the extending direction, of the layer structure on a plane of the surface of the substrate.

18. The display screen of claim 17, wherein the one or more display regions further comprises a second display region, another display panel is disposed in the second display region, the display panel disposed in the first display region is a PMOLED display panel or an AMOLED display panel, and the other display panel disposed in the second display region is an AMOLED display panel.

19. The display screen of claim 18, wherein the first display region has a light transmittance larger than that of the second display panel.

20. A display terminal, comprising:
an equipment body having a device region; and
a display screen covered on the equipment body;
wherein the display screen has one or more display regions, each of the one or more display regions is configured to display static or dynamitic images, the one or more display regions comprises a first display region, and a display panel is disposed in the first display region;
wherein the device region is located under the first display region, and a light-sensitive device is located in the device region to collect lights passing through the first display region;
wherein the display panel comprises:
a substrate;
a pixel-defining layer disposed on the substrate; and
an isolation structure disposed on the pixel-defining layer;
wherein the isolation structure comprises at least two layer structures stacked in sequence along a direction perpendicular to a surface of the substrate; at least one of the at least two layer structures has a width varied continuously or intermittently along an extending direction of the isolation structure; the extending direction of the isolation structure is parallel to the surface of the substrate; and the width of the layer structure refers to a size of a projection, along a direction perpendicular to the extending direction, of the layer structure on a plane of the surface of the substrate.

* * * * *